United States Patent
Klopfenstein

(10) Patent No.: US 9,429,915 B2
(45) Date of Patent: Aug. 30, 2016

(54) ELECTRONIC QUARTZ RESONATOR MODULE PROVIDED WITH SHOCK RESISTANT SECURING MEANS

(71) Applicant: ETA SA Manufacture Horlogere Suisse, Grenchen (CH)

(72) Inventor: Francois Klopfenstein, Delemont (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 0 days.

(21) Appl. No.: 13/939,737

(22) Filed: Jul. 11, 2013

(65) Prior Publication Data

US 2014/0016443 A1    Jan. 16, 2014

(30) Foreign Application Priority Data

Jul. 16, 2012  (EP) ..................... 12176573

(51) Int. Cl.
*G04C 15/00* (2006.01)
*G04F 5/00* (2006.01)
*G04B 17/00* (2006.01)
(Continued)

(52) U.S. Cl.
CPC ............... *G04B 17/00* (2013.01); *G04F 5/06* (2013.01); *G04F 5/063* (2013.01); *G04G 17/06* (2013.01); *G04F 5/066* (2013.01); *H03B 5/36* (2013.01)

(58) Field of Classification Search
CPC ......... G04G 17/06; G04F 5/06; G04F 5/063; G04F 5/066; H03B 5/36
USPC ................ 368/155–157, 159, 160, 168, 287; 331/96, 154, 158, 107 A, 116 M
See application file for complete search history.

(56) References Cited

U.S. PATENT DOCUMENTS 3,805,509 A * 4/1974 Assmus et al. ............... 368/159
3,943,699 A * 3/1976 Daniels .................. G04G 17/02
368/204

(Continued)

FOREIGN PATENT DOCUMENTS

CH          609 528 G A3    3/1979
CN          201699667 U     1/2011
(Continued)

OTHER PUBLICATIONS

European Search Report issued Nov. 1, 2012, in European Application No. 12 17 6573 filed Jul. 16, 2012 (with English Translation).

*Primary Examiner* — Amy Cohen Johnson
*Assistant Examiner* — Daniel Wicklund
(74) *Attorney, Agent, or Firm* — Oblon, McClelland, Maier & Neustadt, L.L.P.

(57) ABSTRACT

The electronic module (1) includes a quartz or MEMS resonator (3), which is confined within a resonator case (5), which is provided with electrical contact pads (15) over at least one external surface for the electrical connection of the resonator. A printed circuit board (6) is also provided for carrying the resonator case (5) and it includes electrical connection terminals (18) for connection to the electrical connection pads (15) of the resonator case. The resonator case (5) is fixedly held inside a case structure (6, 9) of the electronic module (1), via at least one mechanical shock damping element (7). The damping element 7) may be an elastomer element, which includes metal wires (17) for the electrical connection of the resonator case (5) across the printed circuit board (6).

8 Claims, 1 Drawing Sheet

(51) Int. Cl.
*H03B 5/18* (2006.01)
*H03B 5/32* (2006.01)
*H03B 5/30* (2006.01)
*G04G 17/06* (2006.01)
*G04F 5/06* (2006.01)
*G04B 37/00* (2006.01)
*G06F 1/04* (2006.01)
*H03B 7/12* (2006.01)
*H03B 9/12* (2006.01)
*H03H 9/02* (2006.01)
*H03B 5/36* (2006.01)

(56) References Cited

U.S. PATENT DOCUMENTS

| | | | | |
|---|---|---|---|---|
| 4,087,957 A | * | 5/1978 | Miyasaka et al. | 368/187 |
| 4,148,183 A | * | 4/1979 | Murakami | 368/159 |
| 4,196,577 A | * | 4/1980 | Ohno | G04G 17/02 |
| | | | | 368/294 |
| 4,578,612 A | * | 3/1986 | Mooney | 310/348 |
| 5,358,412 A | * | 10/1994 | Maurinus et al. | 439/66 |
| 2004/0155717 A1 | | 8/2004 | Kato | |
| 2005/0085578 A1 | | 4/2005 | Iguchi | |
| 2007/0035214 A1 | * | 2/2007 | Kasahara | 310/348 |
| 2007/0053241 A1 | * | 3/2007 | Meister et al. | 368/232 |
| 2008/0150398 A1 | | 6/2008 | Yoshimatsu et al. | |
| 2009/0201769 A1 | * | 8/2009 | Miyahara | 368/10 |
| 2011/0108312 A1 | * | 5/2011 | Becze et al. | 174/258 |

FOREIGN PATENT DOCUMENTS

| | | |
|---|---|---|
| EP | 1 505 729 A2 | 2/2005 |
| GB | 2 398 167 A | 8/2004 |

* cited by examiner

ELECTRONIC QUARTZ RESONATOR MODULE PROVIDED WITH SHOCK RESISTANT SECURING MEANS

This application claims priority from European Patent Application No. 12176573.9 filed Jul. 16, 2012, the entire disclosure of which is incorporated herein by reference.

FIELD OF THE INVENTION

The present invention concerns an electronic module with a quartz or MEMS resonator, provided with a shock resistant securing means. The quartz or MEMS resonator is confined within a resonator case, which is provided with electrical contact pads over at least one external surface for the electrical connection of the resonator. A printed circuit board carries the resonator case and includes electrical connection terminals for connection to the electrical connection pads of the resonator case

BACKGROUND OF THE INVENTION

An SMD quartz timepiece resonator is generally mounted straight onto a printed circuit board, in order to be rigidly secured to the timepiece movement in the watch. When the watch is subject to mechanical shocks, the quartz resonator in its case may be damaged following the mechanical shocks which are transmitted straight to the resonator. Thus the efficiency of said quartz resonator may deteriorate and thus lead to poor operating accuracy. This risk is even greater for high precision watches which enjoy temperature compensation. A watch provided with a quartz resonator of this type, rigidly secured to the watch movement, is liable to lose accuracy after simply being dropped onto a hard floor, which is a drawback.

CN Patent Application No. 201699667 U discloses a module provided with a plug-in quartz resonator. To contain the quartz resonator, the module includes a metal cover and a base on which the quartz resonator is mounted. The quartz resonator is electrically connected by two conductive flanges to pins coming out of the case for the electrical connection of the module. These conductive flanges provide some elasticity to protect the quartz resonator from any mechanical shock to the module. However, this module cannot easily be integrated in a watch case of small dimensions and does not guarantee proper protection of the quartz resonator when the watch containing the electronic module is subject to mechanical shocks, which is a drawback.

CH Patent No 609 528 B discloses a quartz resonator encapsulated in a metal case. A frame in the form of a spring bar holds and electrically connects the resonator inside the case for electrical connection to the exterior of said case. This metal fastening frame provides the resonator with resistance to mechanical shocks, but the fastening frame is in direct mechanical and electrical contact with the quartz resonator inside the case, which does not provide proper resistance to repeated shocks. This thus constitutes a drawback.

US Patent Application No 2007/0035214 discloses a piezoelectric oscillator. This oscillator includes a piezoelectric resonator which is confined within a resonator case. The resonator case is secured to the base of a case structure via an elastomer buffer element as shock-resistant securing means. The resonator case can also be secured inside the oscillator case structure by being sandwiched by a buffer element. However, no provision is made to sufficiently retain the resonator case in the oscillator case structure to ensure a proper means of shock-resistant securing, which is a drawback.

SUMMARY OF THE INVENTION

It is thus a main object of the invention to overcome the aforementioned drawbacks by proposing an electronic module with a quartz or MEMS resonator, which is provided with novel shock-resistant securing means and is capable of being mounted in a watch, such as a wristwatch.

The present invention therefore concerns an electronic module with a quartz or MEMS resonator, said module comprising:
  the quartz or MEMS resonator confined within a resonator case, which is provided with electrical contact pads over at least one external surface of the resonator case, for the electrical connection of the resonator,
  a printed circuit board for carrying the resonator case and including electrical connection terminals for connection to the electrical connection pads of the resonator case,
  wherein the resonator case is fixedly held in a case structure of the electronic module, sandwiched between two elements for damping mechanical shocks, and wherein the damping elements hold the resonator case and are compressed between two internal walls of the case structure of the electronic module.

Particular embodiments of the electronic module are defined in the dependent claims.

One advantage of the electronic module with a quartz or MEMS resonator of the invention lies in the fact that the damping element, which is preferably an elastomer element, fixedly holds the case containing the quartz or MEMS resonator in the electronic module case structure. When the electronic module is mounted in a watch close to the watch movement, any shock which the watch undergoes is transmitted to the resonator in its case considerably damped by the securing means formed by the elastomer element. This protects said resonator from any mechanical shock and reduces any risk of said resonator losing accuracy or breaking.

Advantageously, two damping elements are disposed on either side of the resonator case to hold it in the electronic module case structure. These two damping elements may be elastomer elements, which may be compressed between two internal walls of the electronic module case structure. One of the elastomer elements may be disposed between the printed circuit board and the resonator case. This elastomer element may also comprise conductive wires for connecting the electrical connection terminals of the printed circuit board to electrical contact pads of the resonator case.

BRIEF DESCRIPTION OF THE DRAWINGS

The objects, advantages and features of the electronic quartz or MEMS resonator module will appear more clearly in the following non-limiting description made with reference to the drawings, in which.

DETAILED DESCRIPTION OF THE INVENTION

In the following description, all those components of the electronic module with a quartz or MEMS resonator of the invention, which are well known to those skilled in the art in this technical field, are described only in a simplified manner. The following description is mainly based on the manner in which the quartz or MEMS resonator case is secured, by shock-resistant securing means, inside a case structure of the electronic module.

Figure 1:
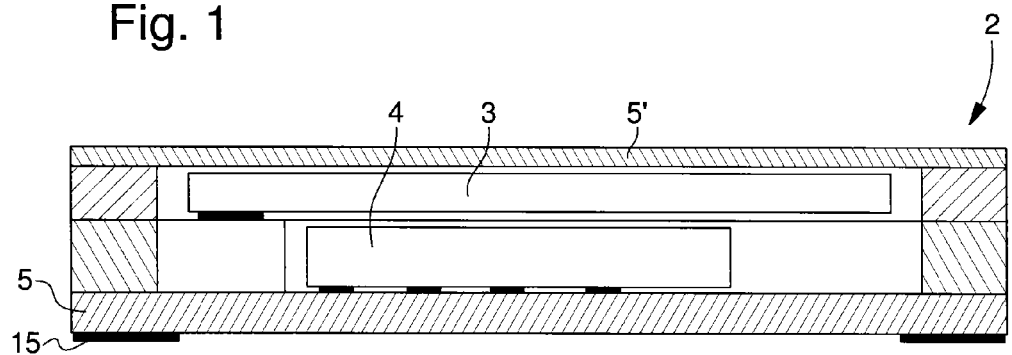
FIG. 1 shows a transverse cross-section of a case containing a quartz resonator for the electronic module according to the invention.

Quartz or MEMS resonator component 2 is shown summarily in FIG. 1. This component 2 includes, for example, a quartz resonator 3 placed in a resonator case 5 which is hermetically sealed by a cover 5'. This resonator case may be made of a metallic or ceramic material. An integrated timepiece circuit 4, connected to said quartz resonator 3, may also be placed in a known manner in the hermetically sealed resonator case. Electrical contact pads 15 are provided on at least one external surface of resonator case 5 for the electrical connection of quartz resonator 3 or of the resonator to the integrated timepiece circuit 4. For example, two, four or eight metal electrical contact pads may be disposed at the four corners of the external rectangular surface of resonator case 5.

A quartz resonator component such as Micro Crystal CM7 or Micro Crystal WM-1322-C7 or WM-1323-C7 may be used for the electronic module. However, other types of quartz or MEMS resonator components may also be used for said electronic module. The dimensions of this type of quartz resonator component may be from 3 to 4 mm long, 1.5 to 2 mm wide and less than 1 mm thick.

Figure 2:
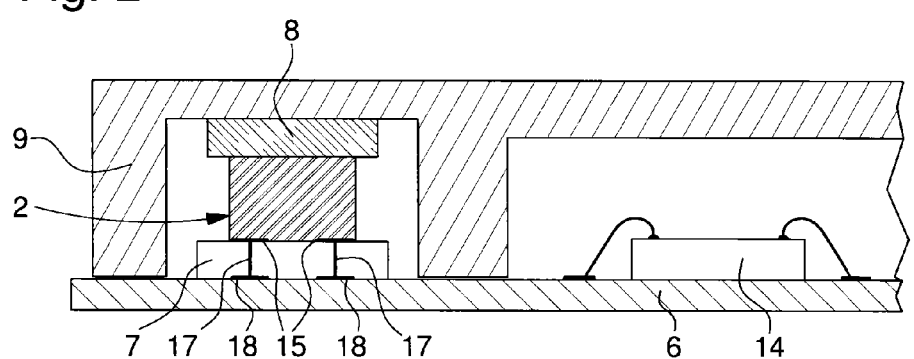
FIG. 2 shows a partial schematic view of a partial cross-section of a first embodiment of electronic module with a quartz or MEMS resonator according to the invention.

FIG. 2 is a schematic view of a first embodiment of electronic module 1 with a quartz or MEMS resonator. The illustration of the various elements in FIG. 2 does not reflect their real dimensions. Quartz or MEMS resonator component 2 is fixedly held in a case structure of electronic module 1 via at least one damping element 7. This damping element, which may be made of elastomer, protects the quartz or MEMS resonator in resonator case 5 from any mechanical shock to the electronic module. Quartz or MEMS resonator component 2 is also mounted on a printed circuit board 6. Component 2 is preferably mounted on rigid printed circuit board 6 via said elastomer element 7.

Electrical connection terminals 18 of said printed circuit board 6 are provided for electrical connection to the electrical contact pads 15 of resonator case 5. Printed circuit board 6 also includes an arrangement of metal paths (not shown). The first damping element 7, which is an elastomer element, includes conductive wires 17 in the elastomer material for connecting electrical contact pads 15 of resonator case 5 to the electrical connection terminals 18 of printed circuit board 6. The electrical connection between connection terminals 18 and contact pads 15 via conductive wires 17 may be achieved simply by contact by compressing elastomer element 7 or by retention using a conductive adhesive.

The first elastomer element 7 is a "zebra" connector. Preferably, this first elastomer element 7 includes rows of regularly spaced metal filaments 17 right through the thickness of said first elastomer element. This, for example silicon elastomer element 7, may be a GB-Matrix type by the Shin-Etsu company. It may have a thickness of between 0.3 and 2.5 mm and be of equivalent length and width to the quartz or MEMS resonator case 5 used.

Preferably, resonator case 5 can be fixedly held in the case structure of electronic module 1, sandwiched between two damping elements 7, 8, which may be elastomer elements of the same or different type. Only the first elastomer element is provided with conductive wires 17. The first elastomer element 7 may be in contact across the entire bottom surface of resonator case 5, whereas the second elastomer element 8 may be in contact across the entire top surface of resonator case 5. Elastomer elements 7 and 8 may also extend on each side of the support surface of resonator case 5. Said damping elastomer elements hold resonator case 5 compressed between two walls or inner surfaces of the case structure of electronic module 1. The two elastomer elements may also be bonded onto the top and bottom surfaces of resonator case 5.

In this first embodiment, the case structure of electronic module 1 comprises a base, which is formed by printed circuit board 6. This printed circuit board is preferably rigid. The case structure of electronic module 1 further includes a rigid cover 9, which is bonded or welded to the printed circuit board to confine resonator case 5 in at least a first cavity. The cover may be made of opaque plastic or of metal. Resonator case 5 is fixedly held in this case structure of electronic module 1, sandwiched between the two elastomer elements 7 and 8. Once cover 9 is secured to the printed circuit board, the two elastomer elements 7 and 8 can also fixedly hold resonator case 5 by compression between the inner surfaces of cover 9 and of printed circuit board 6.

Printed circuit board 6 may also comprise one or several other electronic components, such as an integrated circuit 14, on the same electrical connection surface. This integrated circuit 14 may be used, for example, for controlling the signals supplied by the resonator linked to the clock circuit and for storing various data. Integrated circuit 14 may be located in a second cavity of cover 9. Although not shown in FIG. 2, printed circuit board 6 could also include external connection terminals, which are accessible outside the case structure of electronic module 1.

Figure 3:
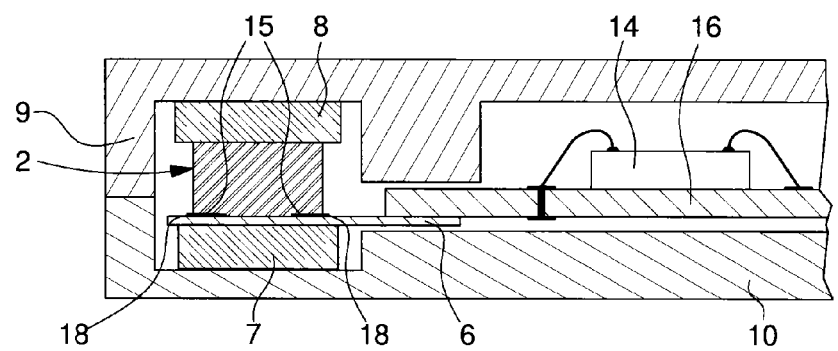
FIG. 3 shows a partial schematic view of a partial cross-section of a second embodiment of the electronic module with a quartz or MEMS resonator according to the invention.

FIG. 3 is a schematic view of a second embodiment of electronic module 1 with a quartz or MEMS resonator. The quartz or MEMS resonator component 2 is mounted straight onto printed circuit board 6, which is preferably flexible. Electrical contact pads 15 of resonator case 5 are welded straight onto electrical connection terminals 18 of flexible printed circuit board 6. Said resonator case 5 secured to printed circuit board 6 is also fixedly held in the case structure of electronic module 1 via at least one damping element 7.

This first damping element 7 may be an elastomer element as in the first embodiment. However, for this second embodiment, the first elastomer element does not have any conductive wires for connecting contact pads 15 to connection terminals 18, since resonator component 2 is fixed straight onto printed circuit board 6. Preferably, resonator case 5 secured to flexible printed circuit board 6 is fixedly held in the case structure of electronic module 1 sandwiched between two damping elements 7 and 8. The two damping elements may be elastomer elements.

The first elastomer element 7 is in contact with an inner surface of a rigid base 10 of the case structure, and the second elastomer element 8 is in contact with an inner surface of a rigid opaque cover 9 of the case structure. Cover 9 is bonded or welded to base 10. When cover 9 is being fixed to the base, the two elastomer elements 7 and 8 may be compressed in order to hold resonator case 5 securely, housed within a first cavity of cover 9.

Flexible printed circuit board 6 may carry other electronic components disposed inside a second cavity of cover 9. An arrangement of metal paths (not shown) of printed circuit board 6 is provided for the electrical connection of said electronic components, such as integrated circuit 14. However, the other electronic components may be mounted on another rigid printed circuit board 16, which is mechanically and electrically connected straight to flexible printed circuit board 6. The connection portion of the two printed circuit boards 6, 16 may be disposed in a passage of suitable size between the two cavities of the case structure. This restricts the movement of the connecting portion of the two printed circuit boards inside the case structure of electronic module 1.

It should be noted that the two printed circuit boards 6 and 16 may form a single part, but with a much smaller thickness for the flexible portion.

From the description that has just been given, several variants of the electronic quartz or MEMS resonator module can be devised by those skilled in the art without departing from the scope of the invention defined by the claims. The damping element(s), such as elastomer elements, may be arranged on lateral sides of the resonator case. The resonator case may be secured to a flexible printed circuit board and held onto the case structure of the electronic module by a damping element secured to a lateral portion of the resonator case. A metal spring flange or any other elastic element capable of damping mechanical shocks to said electronic module may also be used as a damping element. The resonator case may also be secured to the printed circuit board by means of a flexible conductive adhesive resin.

What is claimed is:

1. An electronic module with a quartz or MEMS resonator, said module comprising:
    the quartz or MEMS resonator confined within a resonator case, which is provided with electrical contact pads over at least one external surface of the resonator case, for the electrical connection of the resonator,
    a printed circuit board for carrying the resonator case and including electrical connection terminals for connection to the electrical contact pads of the resonator case,
    wherein the resonator case is fixedly held in a case structure of the electronic module, sandwiched between two elements for damping mechanical shocks, and wherein the damping elements hold the resonator case and are compressed between two internal walls of the case structure of the electronic module,
    wherein the electrical contact pads of the resonator case are secured straight to the electrical connection terminals of the printed circuit board which is flexible,
    wherein the resonator case fixed to the flexible printed circuit board is fixedly held in the case structure of the electronic module sandwiched between the two damping elements, the first damping element of which is in contact with an inner surface of a base of the case structure, and the second damping element of which is in contact with an inner surface of a cover of the case structure, which is secured to the base,
    wherein the electrical connection terminals of the printed circuit board are positioned on a top surface of the printed circuit board between the top surface of the printed circuit board and a bottom surface of the resonator case,
    wherein the first damping element is in contact with a bottom surface of the printed circuit board opposite to the top surface of the printed circuit board,
    wherein the flexible printed circuit board is connected to another rigid printed circuit board carrying other electronic components, and
    wherein the flexible printed circuit board and the rigid printed circuit board form a single part with the flexible printed circuit having a smaller thickness than the rigid printed circuit board, wherein a connection portion of the flexible and rigid printed circuit boards is disposed in a passage between two cavities of the case structure.

2. The electronic module according to claim 1, wherein the damping elements are formed by one or more elastomer elements.

3. The electronic module according to claim 2, wherein a first elastomer element is in contact across an entire bottom surface of the resonator case, and wherein a second elastomer element is in contact across an entire top surface of the resonator case.

4. The electronic module according to claim 1, wherein the two damping elements are elastomer elements which are compressed between the inner surface of the base and the inner surface of the cover.

5. The electronic module according to claim 1, wherein the resonator case and the damping elements are disposed inside the first cavity of the case structure of the electronic module, and wherein one or several electronic components connected across the printed circuit board are disposed inside the second cavity of the case structure of the electronic module.

6. The electronic module according to claim 1, wherein the resonator case includes the quartz or MEMS resonator and an integrated timepiece circuit.

7. An electronic module with a quartz or MEMS resonator, said module comprising:
    the quartz or MEMS resonator confined within a resonator case, which is provided with electrical contact pads over at least one external surface of the resonator case, for the electrical connection of the resonator,
    at least one flexible printed circuit board for carrying the resonator case and including electrical connection terminals for connection to the electrical contact pads of the resonator case,
    wherein the resonator case is fixedly held in a case structure of the electronic module, sandwiched between two elements for damping mechanical shocks, and wherein the damping elements hold the resonator case and are compressed between two internal walls of the case structure of the electronic module,
    wherein the electrical contact pads of the resonator case are secured straight to the electrical connection terminals of the printed circuit board which is flexible,
    wherein the resonator case fixed to the flexible printed circuit board is fixedly held in the case structure of the electronic module sandwiched between the two damping elements, the first damping element of which is in contact with an inner surface of a base of the case structure, and the second damping element of which is in contact with an inner surface of a cover of the case structure, which is secured to the base,
    wherein the electrical connection terminals of the printed circuit board are positioned on a top surface of the printed circuit board between the top surface of the printed circuit board and a bottom surface of the resonator case, wherein the first damping element is in contact with a bottom surface of the circuit board opposite to the top surface of the printed circuit hoard, wherein the flexible printed circuit board is connected to another rigid printed circuit board carrying other electronic components, said flexible printed circuit board having a smaller thickness than the rigid printed circuit board, wherein the resonator case and the damping elements are disposed inside a first cavity of the case structure of the electronic module, and wherein the rigid printed circuit board with electronic components are disposed inside a second cavity of the case structure of the electronic module, wherein a connection portion of the flexible and rigid printed circuit boards is disposed in a passage between the two cavities of the case structure.

8. The electronic module according to claim 7, herein the flexible printed circuit hoard and the rigid printed circuit board form a single part.

* * * * *